United States Patent [19]

Henderson et al.

[11] 4,291,413
[45] Sep. 22, 1981

[54] SEARCH TYPE TUNING SYSTEM WITH DIRECT ADDRESS CHANNEL SELECTION APPARATUS

[75] Inventors: John G. N. Henderson, Princeton; Robert J. Maturo, Bricktown, both of N.J.

[73] Assignee: RCA Corporation, New York, N.Y.

[21] Appl. No.: 80,105

[22] Filed: Sep. 28, 1979

[51] Int. Cl.³ ............................................. H03J 7/22
[52] U.S. Cl. .................................... 455/164; 455/182; 455/184; 455/185
[58] Field of Search ................ 455/164, 182, 184–186; 358/191.1, 195.1

[56] References Cited

U.S. PATENT DOCUMENTS

| 4,031,491 | 6/1977 | Sakamoto | 455/185 |
| 4,093,921 | 6/1978 | Buss | 455/186 |
| 4,155,043 | 5/1979 | Sakamoto | 455/164 |
| 4,209,751 | 6/1980 | Sakamoto | 455/186 |

Primary Examiner—Jin F. Ng
Attorney, Agent, or Firm—Eugene M. Whitacre; Paul J. Rasmussen; Peter M. Emanuel

[57] ABSTRACT

A signal seeking tuning system includes provisions for allowing the direct selection of channels. It includes a memory for storing lower and upper boundaries of a tuning control voltage range for each channel which may be selected. When a channel is selected, a microcomputer causes the memory location corresponding to one of the boundaries associated with the selected channel to be addressed and causes a tuning voltage generator to change the magnitude of the tuning control voltage in the direction of the boundary. A comparator determines when the tuning control voltage reaches the boundary. Thereafter, the microcomputer controls a signal seeking operation between the boundaries to tune the RF carrier associated with the selected channel.

6 Claims, 9 Drawing Figures

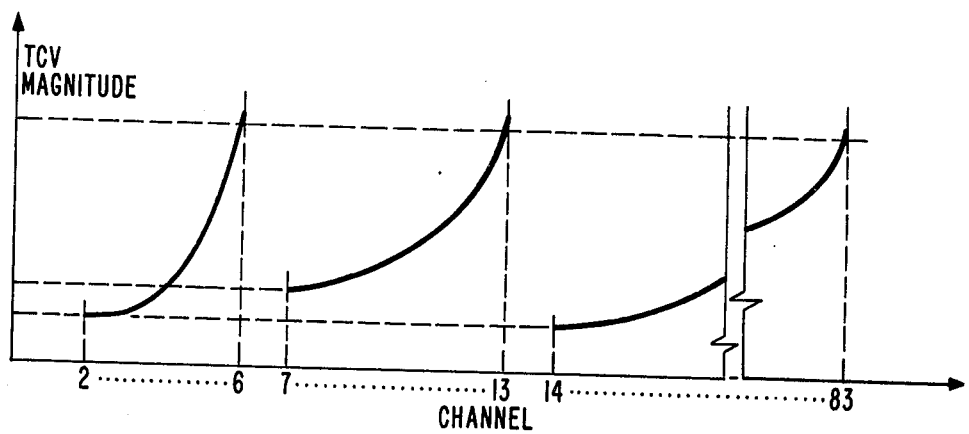

SEARCH TYPE TUNING SYSTEM WITH DIRECT ADDRESS CHANNEL SELECTION APPARATUS

BACKGROUND OF THE INVENTION

The present invention relates to the field of electronic tuning systems.

A variety of electronic tuning systems are known for tuning radio and television receivers in which the magnitude of a tuning voltage determines the frequency to which a voltage controlled tuner is tuned. Electronic tuning systems may be generally categorized as belonging to one of three groups: (1) frequency synthesis type systems including a closed loop for generating the tuning voltage in which the frequency of the local oscillator signal generated by the tuner is compared to a reference signal; (2) memory type systems including a memory for storing binary signals representing the magnitude of the tuning voltage for each channel which may be selected and digital to analog converter for converting the binary signals to the tuning voltage of appropriate magnitude when a respective channel is selected; and (3) search type systems for generating a tuning voltage having a ramp-like magnitude characteristic to sweep the frequency to which the tuner is tuned until an RF carrier with acceptable reception characteristics is located.

Frequency synthesis type tuning systems are relatively accurate, but tend to be relatively expensive because they generally include relatively high speed frequency dividers. Memory type tuning systems are less expensive than the frequency synthesis type tuning systems but tend to be less accurate since memory type tuning systems are essentially open loop systems. Search type tuning systems are generally less expensive than frequency synthesis type tuning systems since they do not require high speed dividers and are generally more accurate than memory type tuning systems because of their closed loop nature.

However, search type tuning systems compare less favorably to frequency synthesis and memory type tuning systems with respect to ease of channel selection. Specifically, in frequency synthesis and memory type tuning systems, the tuning process generally starts with the generation of binary signals representing the selected channel. Therefore, channel selection apparatus for directly selecting a channel, e.g., by depressing digit keys of a keyboard corresponding to the tens and units digits of the associated channel number, is readily incorporated in frequency synthesis and memory type tuning systems. In conventional search type tuning systems, the tuning process generally starts with the location of an RF carrier with acceptable reception characteristics. Therefore, search type tuning systems are not particularly well suited for direct channel selection.

SUMMARY OF THE PRESENT INVENTION

The present invention concerns a search type tuning system that includes generator means for generating a tuning control signal and for selectively increasing or decreasing its magnitude to tune a receiver and detector means for detecting when an RF carrier having acceptable reception characteristics has been located, which is improved by providing apparatus for directly selecting channels. Specifically, a preferred embodiment of the present invention includes memory means having a plurality of memory locations for storing binary signals representing boundaries for the tuning control signal range for each channel that may be selected. When a channel is directly selected, e.g., by means of a keyboard, the memory location storing one of the two boundaries associated with the selected channel is addressed by control means and its contents applied to comparator means for determining the relationship between the tuning control signal and the boundaries. Under the control of the control means, the generator means causes the magnitude of tuning control signal to change in the appropriate sense until the boundary stored in the addressed memory location is reached. Thereafter, the detector means is activated to locate an RF carrier having acceptable reception characteristics. Since an acceptable RF carrier may not be immediately located, under the control of the control means, the generator means causes the magnitude of the tuning control signal to alternately increase and decrease between the boundaries until an acceptable RF carrier is located. To prevent the receiver from tuning another RF carrier during a temporary absence of the RF carrier for the channel, the memory locations for storing the two boundaries associated with a selected channel are alternately addressed at a predetermined rate. If the tuning control voltage exceeds either boundary, under the control of the control means, the generator means causes the magnitude of the tuning control signal to change in the appropriate sense to cause the tuning control signal to once again be between the two boundaries for the selected channel.

BRIEF DESCRIPTION OF THE DRAWING

FIG. 2 is a graphical representation of tuning characteristics of the tuning system of FIG. 1;

FIG. 3 is a table indicating the organization of a memory included in tuning system of FIG. 1;

DETAILED DESCRIPTION OF THE DRAWING

Figure 1:
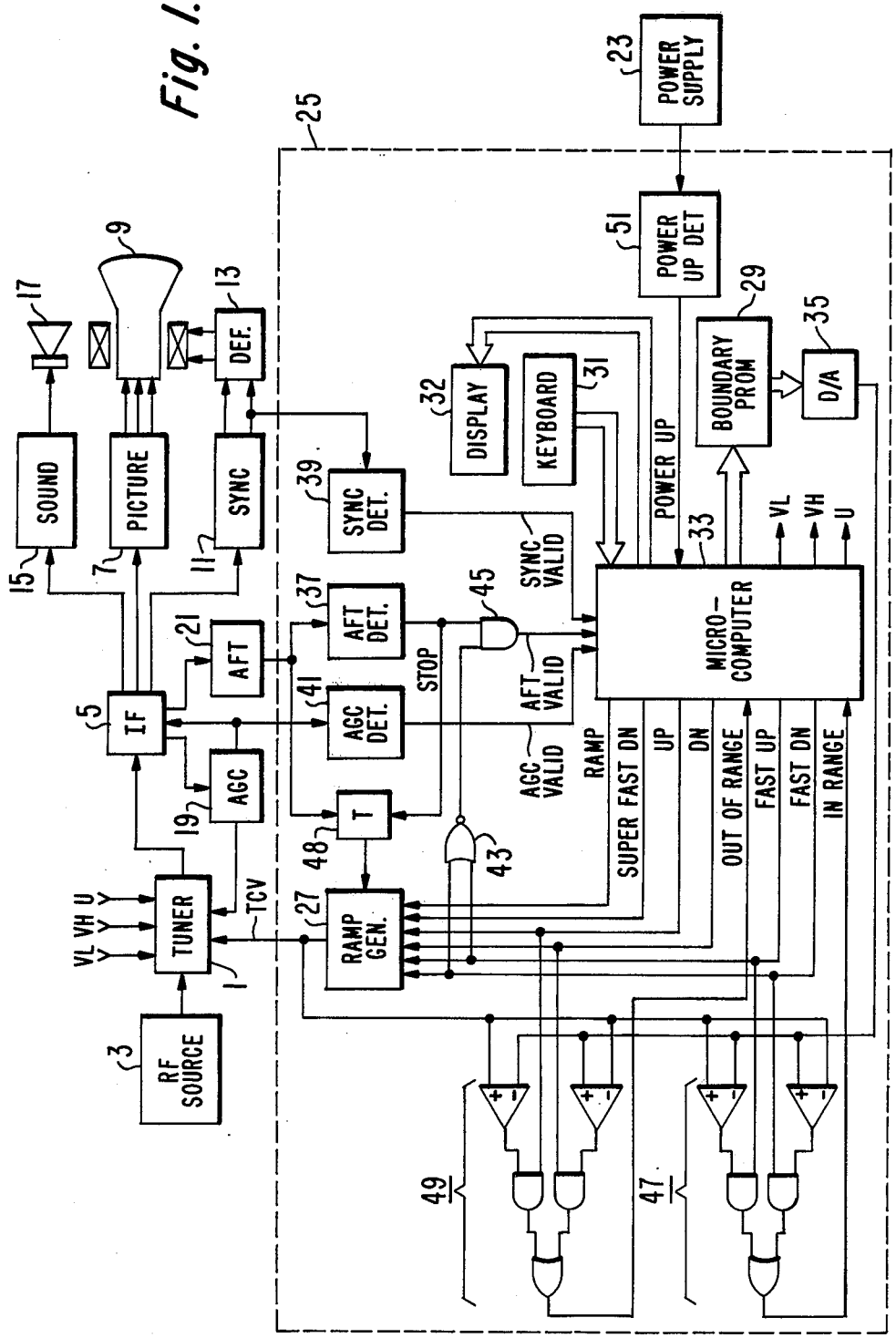
FIG. 1 is a schematic diagram in block form of a television receiver including a tuning system with the preferred embodiment of the present invention.
Figure 4A:
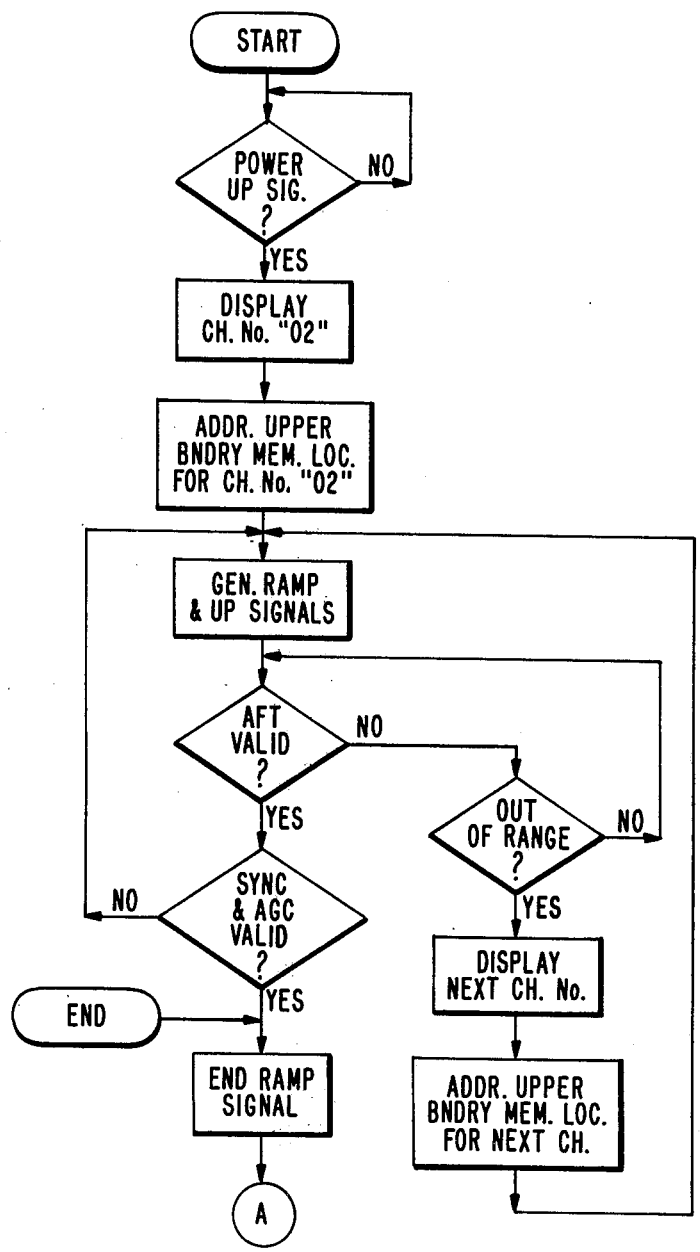
FIGS. 4A–E is a flow chart indicating the sequence of operation of the tuning system of FIG. 1.
Figure 4B:
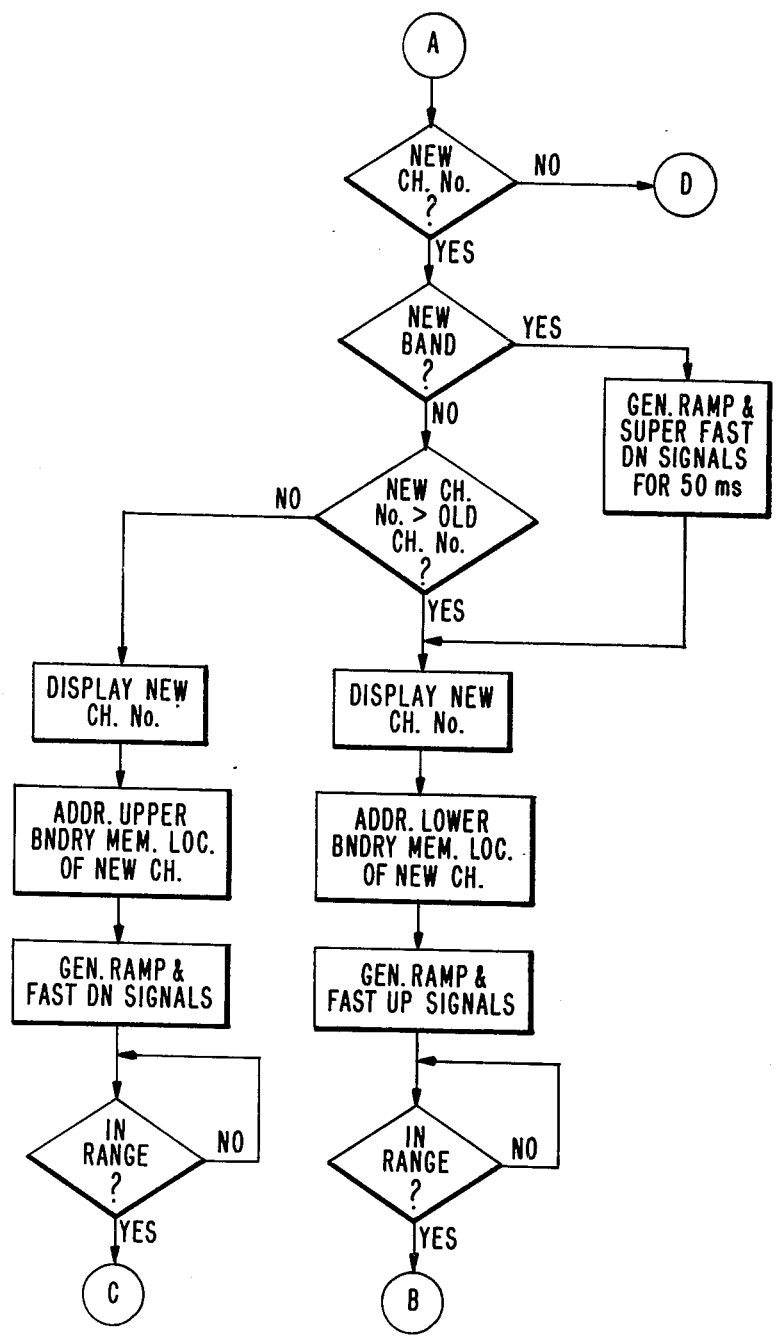
Figure 4D:
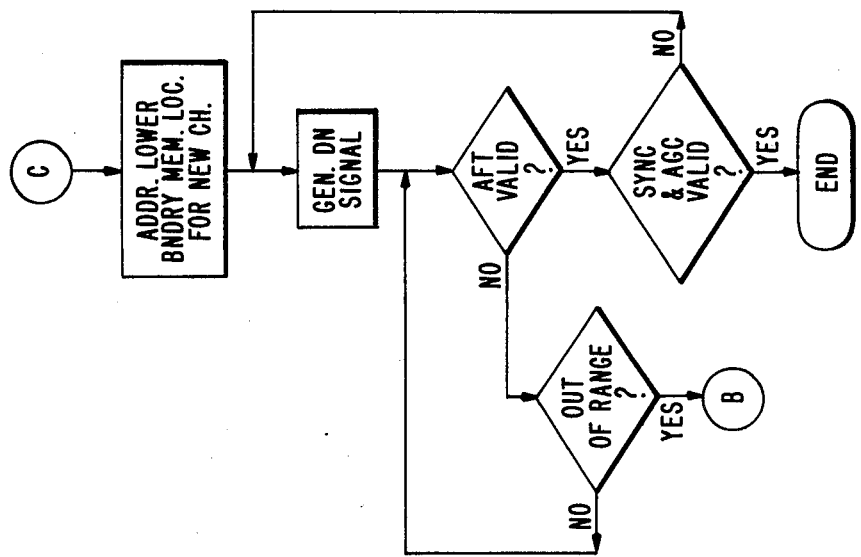
Figure 4C:
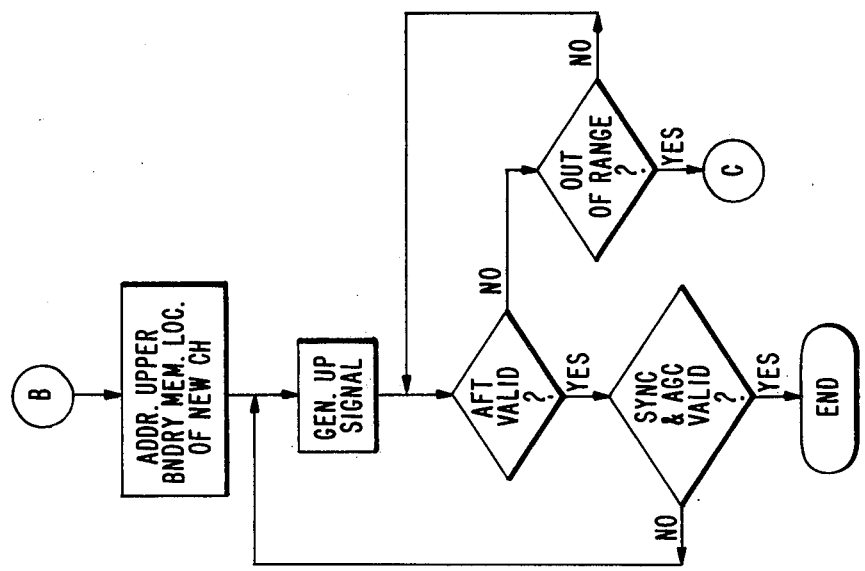
Figure 4E:
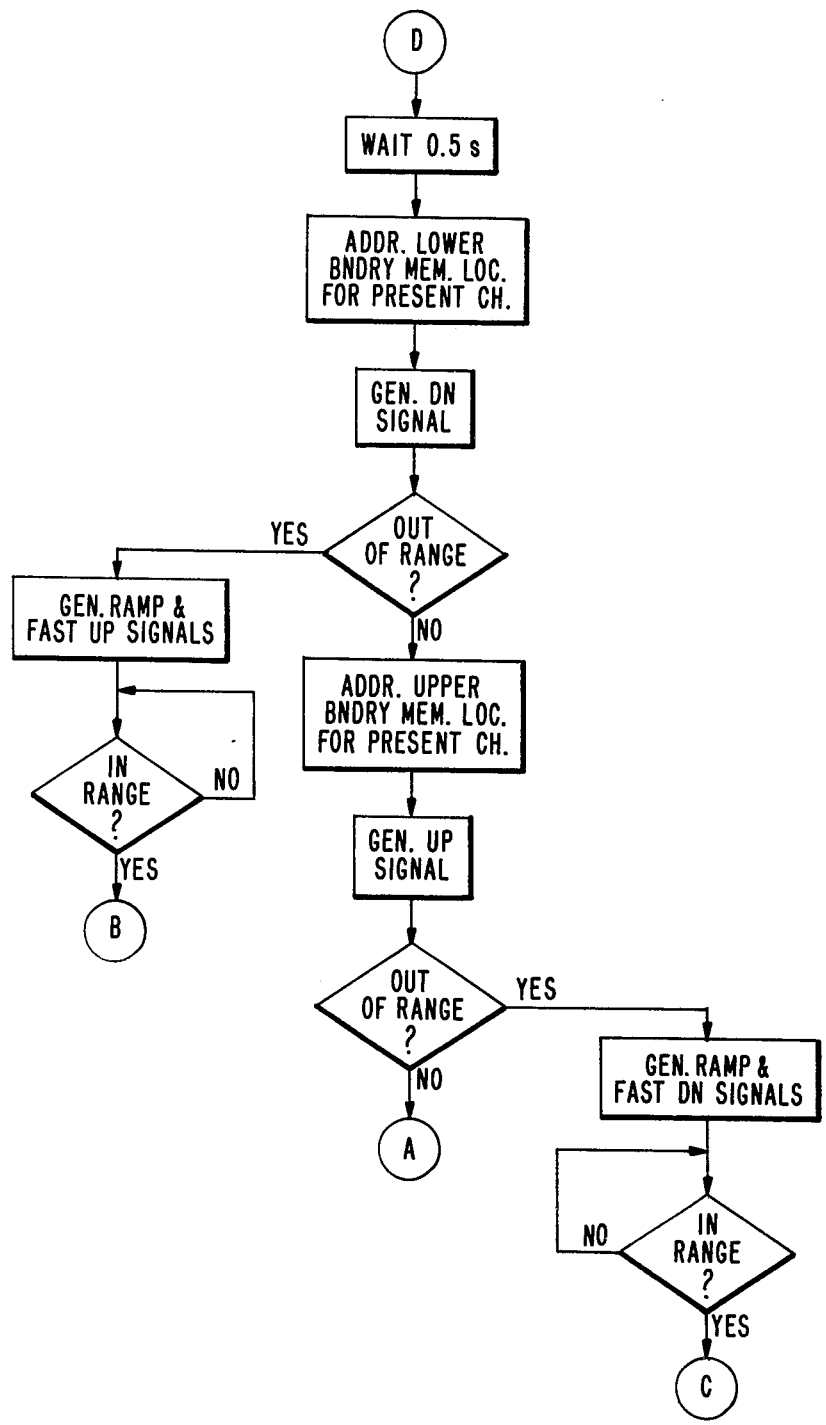
Figure 5:
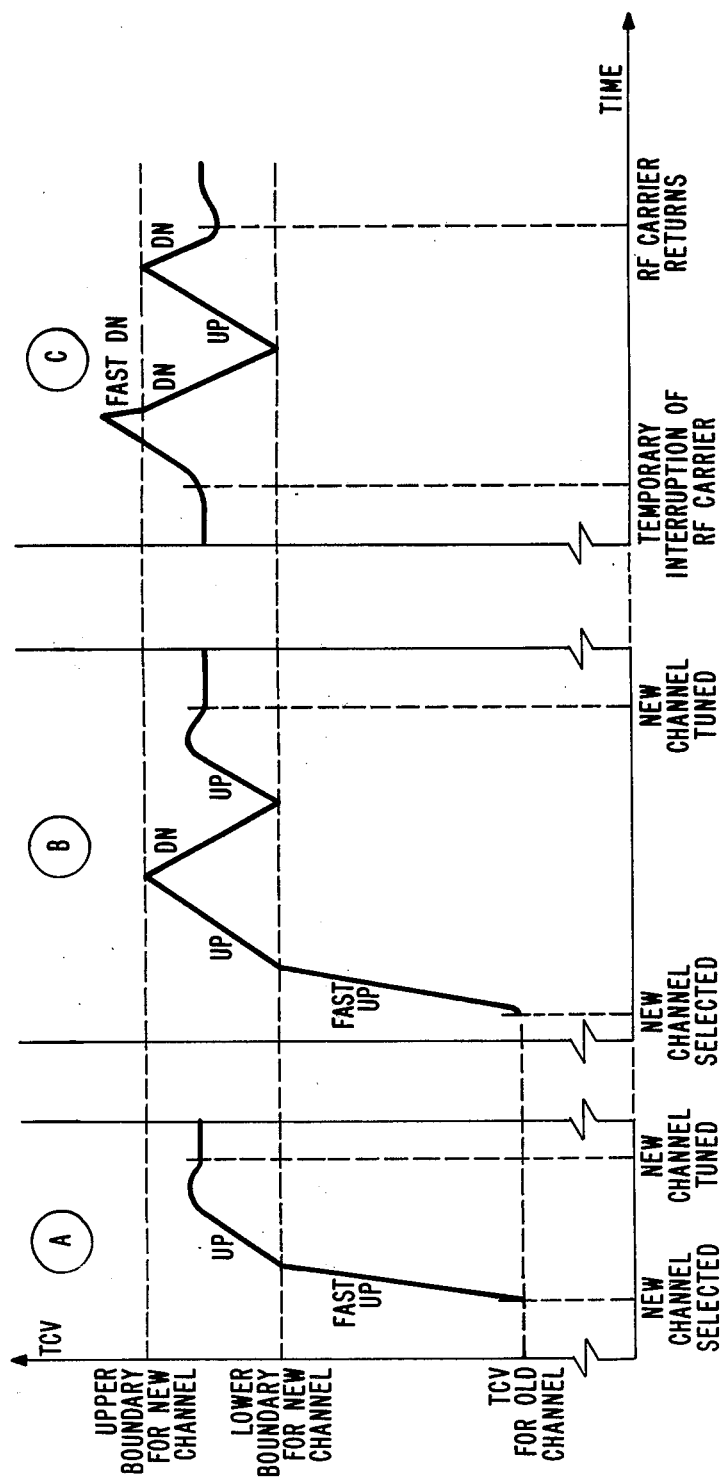
FIG. 5 is a graphical representation of signal waveforms generated by the tuning system of FIG. 1.

The television receiver of FIG. 1 includes a tuner 1 for heterodyning the particular one of a plurality of RF carriers provided by an RF source 3 associated with a selected channel with an internally generated local oscillator signal having a frequency appropriate for tuning the selected RF carrier to derive an IF signal including picture and sound carrier components. The IF signal is filtered and amplified by IF signal processing unit 5. A picture processing unit 7, including luminance and chrominance signal processing circuits (not specifically shown), derives red, green and blue color drive signals from the picture component of the IF signal. A picture tube 9 generates three electron beams corresponding to the color drive signals. A synchronization processing unit 11 derives vertical and horizontal synchronization pulses from the picture component of the IF signal which are utilized by a deflection unit 13 to control the deflection of the electron beams so as to form a visual response on the screen of picture tube 9. A sound processing unit 15 derives an audio signal from the sound component of the IF signal and a speaker 17 generates an audible response in response to the audio signal.

An automatic gain control (AGC) unit 19 generates an AGC signal for controlling the gains of tuner 1 and IF processing unit 5 in response to the amplitude of the IF signal. An automatic fine tuning (AFT) discriminator 21 generates an AFT signal having a generally S-shaped voltage versus frequency characteristic representing the deviation of the frequency of the IF picture component from its desired or nominal value, e.g., in the United States 45.75 MHz. Operating voltages for the receiver are generated by a power supply unit 23.

The portions of the receiver so far described (except the tuning control system) are all well known and may, e.g., comprise corresponding portions of a CTC-color television chassis manufactured by RCA Corporation, Indianapolis, Ind. and described in "RCA Service Data, File C-4, 1978," which is incorporated by reference for the purpose of disclosing possible implementations of these portions. Although the invention is described with reference to a color television receiver, it will be appreciated that the invention has general application in other types of receivers.

Tuner 1 includes an RF unit and a local oscillator (not specifically shown). The RF unit includes tuned circuits in a filter arrangement for selecting one RF carrier from the various RF carriers provided by RF source 3. The local oscillator includes tuned circuits for determining its frequency of oscillation. Each tuned circuit includes an inductance component which is selected in response to band selection signals generated by a tuning control system 25 in accordance with the frequency band in which the selected channel resides; i.e., VL for VHF channels 2 through 6, VH for VHF channels 7 through 13, and U for UHF channels 14 through 83. The selected inductance component determines the tuning range of the tuned circuit. Each tuned circuit also includes a voltage variable capacitance component such as a varactor diode having a value determined by the magnitude of a tuning control voltage (TCV) generated by tuning control system 25. The value of the capacitance component determines the specific frequency to which the tuned circuit is tuned. A graphical representation of the magnitude of the TCV as a function of the channel selected is illustrated in FIG. 2.

Tuning control system 25 is a search type of tuning system which includes portions which are similar to corresponding portions of the search tuning system disclosed in patent applications Ser. Nos. 43,764 and 43,765, both filed on May 30, 1979 and both assigned to the same assignee as the present application, which are hereby incorporated by reference for the purpose of disclosing possible implementations of the corresponding portions. While the manner of channel selection for the search type of tuning system disclosed in the aforementioned patent applications, as for most conventional search type tuning systems, is indirect, i.e., by depressing an "up" or "down" channel selection pushbutton and allowing the tuning system to tune the first higher or lower RF carrier with acceptable reception characteristics after a presently tuned RF carrier the manner of channel selection in the present search type tuning system is direct, i.e., by depressing, in sequence, the two pushbuttons of a calculator-like keyboard corresponding to the tens and units digits of the channel number of the desired channel.

In tuning control system 25, a ramp generator 27 is included for generating the TCV and for selectively causing its magnitude to increase or decrease in ramp-like fashion with various rates of change. Ramp generator 27, for example, comprises an integrator including an operational amplifier having inverting and noninverting inputs and a capacitance network coupled between its inverting input and its output in a negative-feedback arrangement (not specifically shown). With this configuration, the magnitude of the TCV is increased by selectively applying a positive voltage to the noninverting input of the operational amplifier through a resistive network and is decreased by selectively applying a positive voltage to the inverting input through another resistive network. The rate of change of the TCV may be increased by selectively decreasing the resistance value of the resistive networks and decreased by selectively increasing the resistance value of the resistive networks.

A programmable-read-only-memory (PROM) 29 having a plurality of memory locations is included in tuning system 25 for storing binary signals representing the lower and upper boundaries of a tuning voltage range for each channel, i.e., 2 through 83. FIG. 3 graphically illustrates the manner in which the boundaries are stored in boundary PROM 29. The boundaries for channels within a band are substantially equal to the magnitudes of the TCV at frequencies midway between the nominal frequencies of the picture carriers of adjacent channels. As a result, each of these boundary voltages represents the upper end of the TCV range for one channel and the lower end of the tuning voltage range for the next channel. Thus, for example, in the low VHF band the boundaries indicated by $2^+$, $3^+$, $4^+$ and $5^+$ correspond to the highest magnitude of TCV range for channels 2, 3, 4 and 5 as well as the lowest magnitude of the TCV range for channels 3, 4, 5, and 6, respectively and are therefore also identified by $3^-$, $4^-$, $5^-$ and $6^-$. In addition, since the TCV versus channel (see FIG. 2) is discontinuous, a boundary substantially equal to the lowest magnitude of the TCV range for the lowest channel in each band, e.g., $2^-$ and a boundary substantially equal to the highest magnitude of the TCV range for the highest channel in each band, e.g., $6^+$, are stored in boundary PROM 29. As shown, the boundaries may be stored in consecutive memory locations within boundary PROM 29.

Since the information stored in boundary PROM 29 defines the beginnings and ends of the TCV ranges for the various channels that may be selected, it need not be as accurate as if it were utilized to tune the receiver to the RF carriers associated with the channels as is the case in memory-D/A type tuning systems described above. However, since the tuning control voltage versus channel characteristics vary from receiver to receiver, it is desirable that the memory for storing the boundaries be a PROM rather than a ROM (read-only-memory). The manner and apparatus for storing the boundaries in boundary PROM 29 are also disclosed in the beforementioned patent applications.

A microcomputer 33 is the control apparatus for tuning system 25. Microcomputer 33 includes: input and output ports (not specifically shown) for receiving and transmitting binary signals from and to other portions of tuning control system 25; a central processing unit (not specifically shown) for making logical decisions based on the logic levels of the binary signals received by the input ports and in response generating binary signals which are transmitted through the output ports to control the remaining portions of tuning control system 25; and a PROM (not specifically shown) for storing binary signals representing a program for controlling the operation of the central processing unit and thereby, in turn, controlling the operation of the remaining portions of tuning control system 25. The input and output ports may comprise a CDP1852 integrated circuit available from RCA Corporation. The microprocesser may comprise a CDP1802 integrated circuit also available from RCA Corporation. The PROM may comprise a 2758 integrated circuit available from Intel Corporation. In practice, a portion of the PROM included in microcomputer 33 may be utilized as boundary PROM 29. The logic levels of the binary signals utilized in tuning system 25 are selected for positive logic configurations. The flow chart of the program stored in the PROM of microcomputer 33 is shown in FIGS. 4A-4E. It will be appreciated that microcomputer 33 may be replaced by combinational logic circuits designed to accommodate the logic functions specified in the flow chart of FIGS. 4A-4E and for incorporation with other portions of tuning control system 25 in an integrated circuit.

A channel is selected by sequentially depressing the two keys or pushbuttons (not specifically shown) of a calculator-like keyboard 31 associated with the tens and units digits of the channel number. When a key is depressed, four binary signals representing, in binary-coded-decimal format, the associated digits are generated by keyboard 31. Microcomputer 33 reformats the two groups of four binary signals representing the tens and units digits of the channel number sequentially generated by keyboard 31 into a group of eight binary signals representing the full channel number. The eight binary signals are evaluated by microcomputer 31 as will be described below to control the sequence of the tuning process. In addition, the eight binary signals representing the full channel number are evaluated to determine the band of the selected channel in order to generate the appropriate one of the VL, VH and U band selection signals. The eight binary signals representing the full channel number are applied to a channel number display unit 32.

The operation of tuning control system 25 after a new channel has been selected will now be described. Reference to FIGS. 4B-4E and 5 will be helpful. After a new channel has been selected, microcomputer 33 generates binary signals for addressing the memory location corresponding to the lower boundary associated with the newly selected channel, if the newly selected channel has a higher channel number than the previously selected channel, or the memory location corresponding to the upper boundary associated with the newly selected channel, if the newly selected channel has a lower channel number than the previously selected channel. (This assumes for the moment that the newly selected channel and the previously selected channel are in the same band. The other situation will be discussed below.) The contents of the addressed memory location are converted to a corresponding voltage by a digital-to-analog converter 35 for comparison to the TCV as will be described below. In addition, when a new channel is selected, microcomputer 33 generates a RAMP signal and either FAST UP signal, if the newly selected channel has a higher channel number than the previously selected channel, or FAST DN (DowN) signal, if the newly selected channel has a lower channel number than the previously selected channel. (Specifically, see FIGS. 4B and 5, part "(A)".) The RAMP signal enables ramp generator 27 to either increase or decrease the magnitude of the TCV. The FAST UP signal causes ramp generator 27 to increase the magnitude of the TCV at a relatively high rate e.g., 0.14 volts per millisecond. The FAST DN signal causes ramp generator 27 to decrease the magnitude of the TCV at approximately the same rate as that associated with the FAST UP signal.

When the magnitude of the TCV is being rapidly increased or decreased in response to the RAMP signal and either the FAST UP or FAST DN signals, respectively, the RF carrier detection apparatus of tuning system 25 is disabled. Specifically, and AFT detector 37, a SYNC detector 39 and an AGC detector 41 are provided for evaluating the amplitude of the AFT and AGC signals and the average value of synchronization pulses, respectively, as will be described below to determine if a received RF carrier is acceptable. When either a FAST UP or FAST DN signal is generated, a high logic level is applied to a corresponding input of a NOR gate 43. In response NOR gate 43 generates a low logic level which disables an AND gate 45 from applying the output signal of AFT detector 37 to microcomputer 33. As a result, the presence of an RF carrier will not be detected during "fast ramping." This prevents an RF carrier corresponding to a channel other than the selected one from being tuned.

Hereinafter, by way of example, it will be assumed that the newly selected channel has a higher channel number than the previously selected channel. The situation in which the newly selected channel has a lower channel number than the previously selected channel is analogous and will not be described in detail.

When the newly selected channel has a higher channel number than the previously selected channel, a comparator 47, enabled by the FAST UP signal, generates an IN RANGE signal when the magnitude of the TCV reaches the lower boundary. In response, microcomputer 33 ends the FAST UP signal. When the FAST UP signal ends, both inputs of NOR gate 43 are at low logic levels. In response, a high logic level is developed at the output of NOR 43 and AND gate 45 is enabled to couple the output signal of AFT detector 37 to microprocessor 33. As a result, the presence of an acceptable RF carrier can thereafter be detected.

When the FAST UP signal ends, microcomputer 33 generates an UP signal. In response to the UP signal and the RAMP signal, which continues to be generated after the FAST UP signal ends, RAMP generator causes the magnitude of the TCV to continue to increase but at a slower rate, e.g., 0.04 volts per millisecond, than the "fast ramping" rate. (Specifically, see FIGS. 4C and 5, part "(A)") Since the RF carrier detection apparatus has been enabled at the end of the FAST UP signal, if an acceptable RF carrier is present for the selected channel, it will be located while the magnitude of the TCV is being slowly increased.

An acceptable RF carrier is located in the following manner. AFT detector 37 generates a STOP signal when the amplitude of the AFT signal is between predetermined threshold values defining the control range of the AFT signal (i.e., the range between the positive and negative going peaks of the signal s-shaped characteristic of the AFT signal). This signifies the presence of an RF carrier. The STOP signal is applied to microcomputer 33 through enabled AND gate 45 as an AFT VALID signal. In response to the AFT VALID signal, microcomputer 33 ends the RAMP and UP signals. Accordingly, the TCV stops changing. In addition, in response to the STOP signal, a transmission (T) gate 48 is enabled to couple the AFT signal generated by discriminator 21 to ramp generator 27. In response to the AFT signal, the TCV is modified, as needed, to change the frequency of the local oscillator signal to reduce the frequency deviation between the detected carrier and 45.75 MHz.

After predetermined time delay e.g., 400 milliseconds, (not indicated in the flow chart) after the generation of the AFT VALID, which delay is selected to allow synchronization unit 15 and AGC detector 19 to settle and which is determined by microcomputer 33, microcomputer 33 examines the output signals of SYNC detector 39 and AGC detector 41. SYNC detector generates a SYNC VALID signal when the average value of the horizontal synchronization pulses generated by synchronization processing unit 11 is within a predetermined range of values, signifying the detected carrier is the picture carrier and not an undesired carrier such as a sound carrier. AGC detector 41 generates an AGC VALID signal when the AGC signal for IF processing unit 5 is above a predetermined threshold value signifying that the detected carrier has sufficient signal strength to produce an acceptable picture. The IF AGC signal is utilized rather than the RF AGC signal since the RF AGC typically remains constant until the signal strength is appreciable. The predetermined AGC threshold value may be made adjustable according to viewer preference of signal strength. Since viewer preference is subjective, the use of AGC may be deleted to effect a cost saving.

If all of the AFT VALID, SYNC VALID and AGC VALID signals have been generated, the tuning process is at an end with the RF carrier for the selected channel tuned. However, if the AFT VALID signal has not been generated or one of the SYNC VALID or AGC VALID signals has not been generated, the RAMP and UP signals are regenerated, respectively, by microcomputer 33 and the TCV is caused to increase.

To prevent the TCV from reaching a magnitude corresponding to the next higher channel and thereby erroneously tuning its RF carrier, as soon as comparator 47 has detected that the TCV has reached the lower boundary for the selected channel, after the channel is selected, microcomputer 33 addresses the memory location corresponding to the upper boundary for the selected channel. Thereafter, if no RF carrier is detected as the magnitude of the TCV is increased in response to the UP signal, when the TCV reaches the upper boundary, a comparator 49, enabled by the UP signal, generates an OUT-OF-RANGE signal. In response, microcomputer 33 ends the UP signal and generates a DN signal. In response to the DN signal and the RAMP signal, which continues to be generated after the UP signal ends, ramp generator 27 causes the magnitude of the TCV to decrease at approximately the same rate as that associated with the UP signal. At the same time microcomputer 33 causes the memory location corresponding to the lower boundary to be addressed. If no RF carrier is detected as the magnitude of the TCV is decreased in response to the DN signal, when the TCV reaches the lower boundary, comparator 49, enabled by the DN signal, generates another OUT-OF-RANGE signal. In response, microcomputer 33 ends the DN signal and again generates the UP signal and addresses the memory location corresponding to the upper boundary. (Specifically, see FIGS. 4C, 4D and 5, part "(B)").

If no RF carrier is located, the alternating upward and downward searches between the lower and upper boundaries continue as long as another channel is not selected. Typically, if an acceptable RF carrier for the selected channel is present, it will be located during the first upward search after the channel is selected. However, the alternating upward and downward search is desirable, not only for preventing the RF carrier for next higher channel from being erroneously tuned, as earlier mentioned, but also for allowing the RF carrier for the selected channel to be tuned, although it is absent at the time the selected channel is selected, if it should become present thereafter.

It is possible for the reception of an RF carrier to be temporarily interrupted, e.g., due to a loose antenna connection or when an antenna is rotated to a new position. In this situation, it is possible for the AFT signal generated by discriminator 21 to cause the TCV drift away from the magnitude at which the RF carrier for the selected channel was tuned. If the TCV drifts in a direction away from the boundary associated with the memory location last addressed before the RF carrier for the selected channel was tuned, the TCV may drift across the opposite boundary and into the tuning range of the adjacent channel without the occurrence being detected. To prevent this occurrence and thereby inhibit the RF carrier of the adjacent channel from being erroneously tuned, while a channel is tuned (i.e., no new channel is selected), microcomputer 33 causes the memory locations corresponding to the lower and upper boundaries of the selected channel to be alternately addressed at a predetermined rate, e.g., 0.5 seconds while synchronously causing the DN and UP signals, respectively, to be alternately generated. (Specifically, see FIGS. 4E and 5, part "(C)"). In response to the DN signal, comparator 49 is enabled to determine if the TCV drifts across the upper boundary. In response to the UP signal, comparator 49 is enabled to determined if the TCV drifts across the lower boundary. As a result, after the RF carrier for selected channel is tuned, comparator 49 is alternately enabled to determine if either the upper or lower boundary associated with the selected channel has been crossed.

If the TCV drifts outside of the TCV range by crossing the lower boundary, in response to the OUT-OF-RANGE signal generated by comparator 49, microprocessor 33 generates a RAMP signal and a FAST UP signal. As a result, ramp generator 27 causes the magnitude of the TCV to rapidly increase. Thereafter, when the lower boundary is again crossed, this time in the correct direction, comparator 47 generates an IN RANGE signal. In response, microprocessor 33 generates an UP signal. As a result, ramp generator 27 is caused to slowly increase the magnitude of the TCV and search operation between the boundaries, previously described, is initiated.

If the TCV drifts outside of the TCV range by crossing the upper boundary, in response to the OUT-OF-RANGE signal generated by comparator 49, microprocessor 33 generates a RAMP signal and a FAST DN signal. As a result, ramp generator 27 causes the magnitude of the TCV to rapidly decrease. Thereafter, when the upper boundary is again reached, this time in the correct direction, comparator 47 generates an IN RANGE signal. In response, microprocessor 33 generates a DN signal. As a result, ramp generator 27 is caused to slowly decrease the magnitude of the TCV and the search operation between the boundaries is initiated.

As earlier mentioned, the tuning operation when a newly selected channel is in a different band than the previously selected channel is slightly different than the tuning operation when a newly selected channel is in the same band as the previously selected channel. The difference arises because it is difficult to predict what the relationship between the magnitudes of the tuning voltages of two channels in different bands is. E.g., the magnitude of the TCV for channel 5 may be higher or lower than the magnitude of the TCV for channel 10. Therefore it is not known in advance whether to ramp upward or downward from the previous magnitude of the TCV. Accordingly, when a newly selected channel is in a different band than the previously selected channel, the TCV is caused to be at a magnitude equal to or below the lowest boundary in the band and thereafter caused to ramp upward to the lower boundary for the selected channel. Specifically, when a newly selected channel is in a different band than the previously selected channel, microcomputer 33 generates a RAMP signal SUPER FAST DN signal. (Specifically, see FIG. 4B). In response ramp generator 27 causes the magnitude of the TCV to be rapidly decreased at a predetermined rate, e.g. 0.5 volts per millisecond, which is faster than the fast ramping rate, for a predetermined time selected so that the TCV reaches the predetermined magnitude lower than the lowest boundary voltage in each of the bands. Thereafter, microcomputer 33 generates a FAST UP signal and addresses the memory location corresponding to the lower boundary for the selected channels. From this point on the tuning operation is the same as previously described when the newly selected channel and the previously selected channel are in the same bands.

Search type tuning systems are capable of locating and tuning RF carriers having predetermined conditions and passing over RF carriers not having the predetermined conditions. Tuning control system 25 advantageously employs its signal seeking provisions to automatically select the lowest channel having an acceptable RF carrier after the receiver is turned on. Specifically, when the receiver is turned on, a power up detector generates a POWER UP signal when a predetermined one of the power supply voltages developed by power supply 23 reaches a predetermined level. In response, microcomputer 33 addresses the memory location corresponding to the upper boundary of the lowest channel, e.g., channel 2, and generates RAMP and UP signals. (Specifically, see FIG. 4A). At the same time, microcomputer 33 generates binary signals representing channel number "02" which are coupled to display 32. In response to the RAMP and UP signals, ramp generator 27 causes the magnitude of the TCV to increase. If an RF carrier is detected by the signal seeking provisions, i.e., AFT detector 37, SYNC detector 39 and AGC detector 41, before the magnitude of the TCV reaches the upper boundary for channel 2, the tuning process is finished with the RF carrier for channel 2 tuned and channel number "02" displayed. If the magnitude of the TCV exceeds the upper boundary for channel 2 before an RF carrier is detected, as manifested by the generation of an OUT-OF-RANGE SIGNAL, microcomputer 33 addresses the memory locations corresponding to successively higher channels and generates binary signals representing respective channel numbers until an RF carrier is located.

It will be appreciated that tuning control system 25 may be modified to selectively operate at the user's discretion either as a signal seeking tuning system in which only channels having RF carriers with acceptable characteristics are tuned as described in the aforementioned patent applications or as a direct selection tuning system as described in the present application. These and other modifications are intended to be within the scope of the present invention as defined by the following claims.

What is claimed is:

1. In a receiver including tuning means for selectively tuning the RF carriers associated with respective channels in response to the magnitude of a tuning control signal and deriving from a selected one of said RF carriers an IF signal having at least one information bearing carrier, apparatus comprising:

channel selection means for generating binary signals representing the channel number of a selected channel;

memory means having a plurality of memory locationns for storing binary signals representing lower and upper boundaries of the tuning control signal for each of said channels;

control means responsive to said binary signals representing the channel number of said selected channel for selectively addressing the memory locations associated with at least one of the lower or upper boundaries for said selected channel when a new channel is selected;

generator means for generating said tuning control signal and cooperating with at least said control means and said memory means for selectively causing its magnitude to increase or decrease in ramp-like fashion from a magnitude substantially equal to a first boundary for said selected channel;

comparison means for comparing the boundary associated with an addressed one of said memory locations and the magnitude of said tuning control signal; and detector means for determining when said IF signal has predetermined conditions when enabled in response to one of said control means and said comparison means when the magnitude of said tuning control signal substantially equals said first boundary for said selected channel;

said generator means being enabled in response to said detector means to cause the magnitude of said tuning control signal to remain substantially constant after said IF signal has said predetermined conditions;

said generator means being enabled in response to said comparison means to cause the magnitude of said tuning control signal to stop changing in said selected sense when the magnitude of said tuning control signal corresponds to the second boundary for the selected channel in a predetermined manner.

2. The apparatus recited in claim 1 wherein:

said control means initially addresses said memory location associated with said first boundary for the selected channel when a new channel is selected and thereafter when enabled in response to said comparison means addresses the memory location associated with the other one of the boundaries for said selected channel when the magnitude of said tuning control signal corresponds to the boundary associated with a presently addressed one of said memory locations in said predetermined manner; and said generator means changes the sense of change of the magnitude of said tuning control signal when the magnitude of said tuning control signal corresponds to the boundary associated with a newly addressed one of said memory locations in said predetermined manner.

3. The apparatus recited in claim 2 wherein:

said control means alternately addresses the memory locations associated with the lower and upper boundaries for the selected channel at a predetermined rate when enabled in response to said detector means when said IF signal has predetermined conditions; and said generator means changes the sense of change of the magnitude of said tuning control signal when the magnitude of said tuning control signal corresponds to one of the lower and upper boundaries for said selected channel.

4. The apparatus recited in claim 3 wherein:

said generator means causes the magnitude of said tuning control signal to change substantially at a first predetermined rate from the magnitude established for a presently selected channel toward a first boundary associated with a newly selected channel when a new channel is selected and when enabled in response to said comparison means causes the magnitude of said tuning control signal to change toward the second boundary associated with said new channel at a second predetermined rate lower than said first predetermined rate after the magnitude of said tuning control signal substantially equals said first boundary associated with said new channel in said predetermined manner.

5. The apparatus recited in claim 4 wherein:

said control means addresses the memory location associated with the lower boundary for the selected channel when a new channel is selected which is in the same frequency band as the previously selected channel and which has a higher channel number than the last selected channel and addresses the memory location associated with the upper boundary for the selected channel when a new channel is selected which is in the same frequency band as the last selected channel is selected and which has a lower channel number than the previously selected channel; and said generator means causes the magnitude of said tuning control signal to increase when a new channel is selected which is in the same frequency band as the previously selected channel and which has a higher channel number than the previously selected channel and causes the magnitude of said tuning control signal to decrease when a new channel is selected which is in the same frequency band as the previously selected channel and which has a lower channel number than the last selected channel.

6. The apparatus recited in claim 5 wherein:

said control means addresses the memory location associated with the lower boundary for the selected channel when a new channel is selected which is in a different band than the last selected channel; and said generator means causes the magnitude of the tuning control signal to increase from a predetermined value at least as low as the lowest magnitude of said tuning control signal for the channel having the lowest channel number in the new band when a new channel is selected which is in a different band than the last selected channel.

* * * * *